(12) United States Patent
Setlur et al.

(10) Patent No.: US 7,077,978 B2
(45) Date of Patent: Jul. 18, 2006

(54) PHOSPHORS CONTAINING OXIDES OF ALKALINE-EARTH AND GROUP-IIIB METALS AND WHITE-LIGHT SOURCES INCORPORATING SAME

(75) Inventors: Anant Achyut Setlur, Niskayuna, NY (US); Alok Mani Srivastava, Niskayuna, NY (US); Holly Ann Comanzo, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/644,103

(22) Filed: May 14, 2004

(65) Prior Publication Data

US 2005/0253114 A1 Nov. 17, 2005

(51) Int. Cl.
*H01J 61/44* (2006.01)
*C09K 11/64* (2006.01)
*C09K 11/80* (2006.01)

(52) U.S. Cl. .............. 252/301.4 R; 313/467; 313/486; 313/503; 313/639; 257/98; 252/301.6 R; 252/301.4 P; 252/301.4 H; 252/301.5; 252/301.4 F

(58) Field of Classification Search ............ None
See application file for complete search history.

(56) References Cited

U.S. PATENT DOCUMENTS 5,611,959 A * 3/1997 Kijima et al. ......... 252/301.4 R
5,735,921 A * 4/1998 Araujo et al. ............. 65/32.1
5,777,350 A 7/1998 Nakamura et al.
5,998,925 A 12/1999 Shimizu et al.
6,096,243 A * 8/2000 Oshio et al. .......... 252/301.4 R
6,252,254 B1 * 6/2001 Soules et al. ............. 257/89
6,565,771 B1 5/2003 Ono et al.
6,685,852 B1 * 2/2004 Setlur et al. ......... 252/301.4 R
6,805,600 B1 * 10/2004 Wang et al. .............. 445/24
2003/0075705 A1 * 4/2003 Wang et al. ......... 252/301.4 P

FOREIGN PATENT DOCUMENTS

JP          08-283712      * 10/1996
JP       2000-109826      *  4/2000

OTHER PUBLICATIONS

S. Shionoya and W.M. Yen (ed.), "Phosphors Handbook", pp. 389-394, 416-419, CRC Press, Boca Raton (1999).

* cited by examiner

*Primary Examiner*—C. Melissa Koslow
(74) *Attorney, Agent, or Firm*—Fletcher Yoder

(57) ABSTRACT

A phosphor comprises a material having a formula of $AMgD_{10}O_{17}:Eu^{2+},Mn^{2+}$, wherein A is at least an alkaline-earth metal selected from the group consisting of Ba, Sr, Ca, and combinations thereof; and D is at least a metal selected from the group consisting of Al, Ga, In, and combinations thereof; wherein $Eu^{2+}$ ions are present in an amount from about 10 to about 50 atom percent of a combined quantity of A ions and europium ions, and $Mn^{2+}$ ions are present in an amount from about 5 to about 30 atom percent of a combined quantity of magnesium ions and manganese ions. The phosphor is used alone or in conjunction with other phosphors to convert UV/blue radiation emitted by a source, such as an LED or a gas discharge device, to visible light.

32 Claims, 7 Drawing Sheets

PHOSPHORS CONTAINING OXIDES OF ALKALINE-EARTH AND GROUP-IIIB METALS AND WHITE-LIGHT SOURCES INCORPORATING SAME

BACKGROUND OF THE INVENTION

The present invention relates to phosphors containing oxides of alkaline-earth and Group IIIB metals, and light sources using these phosphors. In particular, the present invention relates to phosphors containing at least oxides of at least a Group-IIIB metal, magnesium, and at least another alkaline-earth metal.

A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range. Well-known phosphors have been used in mercury vapor discharge lamps to convert the ultraviolet ("UV") radiation emitted by the excited mercury vapor to visible light. Other phosphors are capable of emitting visible light upon being excited by electrons (used in cathode ray tubes) or X rays (for example, scintillators in X-ray detection systems).

The efficiency of a lighting device that uses a phosphor increases as the difference between the wavelength of the exciting radiation and that of the emitted radiation narrows. Therefore, in the quest for improving efficiency of white light sources, effort has been dedicated to finding a source of stimulating radiation that has wavelengths as close to the visible light wavelengths as possible, and phosphors that respond to those wavelengths. Recent advances in light-emitting diode ("LED") technology have brought efficient LEDs emitting in the near UV-to-blue range. The term "near UV" as used herein means UV radiation having wavelengths in the range from about 250 nm to about 400 nm. These LEDs emitting radiation substantially in a portion of the near UV-to-blue range will be hereinafter called "UV/blue LEDs." As used herein, a UV/blue LED may emit radiation having wavelengths in the near UV range, in the blue light range, or in a broad range from near UV to blue. As used herein, the term "near UV-to-blue" wavelength range means from about 250 nm to about 480 nm. It would be an advance to the technology of lighting to provide a range of phosphors that can be stimulated by the radiation emitted from these UV/blue LEDs radiation sources to allow for a flexibility in the use of phosphors for generating various color LEDs. Such phosphors when combined with the emission from the UV/blue LEDs can provide efficient and long lasting lighting devices that consume little power.

Some UV/blue LEDs based on combinations of nitrides of indium, aluminum, and gallium have recently been developed. For example, U.S. Pat. No. 5,777,350 disclosed LEDs comprising multiple layers of indium and gallium nitrides and p- and n-type AlGaN, which emit in the wavelength range of about 380 nm to about 420 nm. The active layer of such an LED may be doped with other materials to shift the LED peak emission within this wavelength range. An LED having a peak emission in the blue light wavelengths was combined with a coating of a yellow light-emitting yttrium aluminum garnet phosphor activated with cerium ("YAG:Ce") to produce white light is disclosed in U.S. Pat. No. 5,998,925. Although a substantial portion of the need for white light devices may be filled by LED-based devices, the ability to combine a UV/blue LED with a phosphor has been limited because YAG:Ce has been the only known yellow light-emitting phosphor that is excitable by radiation in the blue range. However, using a single phosphor in conjunction with an LED emission limits the ability of lighting developers in achieving higher efficiency and the freedom to vary the correlated color temperature and/or the color rendering index ("CRI") of the light source.

Therefore, there is a continued need to provide more efficient phosphors that are excitable in the near UV-to-blue wavelength range and that emit in the visible wavelength range. It is also desirable to incorporate such phosphors in light sources to provide white light with high efficiency and/or high CRI.

SUMMARY OF THE INVENTION

The present invention provides phosphors that are excitable by radiation having wavelength in the range from about 250 nm to about 480 nm, preferably from about 250 nm to about 420 nm, to emit efficiently a visible light in the blue-to-green wavelength range. In general, the phosphors of the present invention comprise oxides of magnesium, at least another alkaline-earth metal, and at least a Group-IIIB metal. The phosphors has a general formula of $AMgD_{10}O_{17}$: $Eu^{2+},Mn^{2+}$; wherein A is at least an alkaline-earth metal selected from the group consisting of Ba, Sr, and Ca; and D is at least a Group-IIIB metal selected from the group consisting of Al, Ga, In, and combinations thereof. In this formula, the elements that follow the colon denote the activators.

In one aspect of the present invention, a portion of Mg is substituted with Zn.

In still another aspect of the present invention, a light source comprises: (a) a radiation source emitting radiation having wavelengths in a range from about 250 nm to about 440 nm; and (b) an amount of phosphor that comprises at least a phosphor having a formula of $AMgD_{10}O_{17}$:$Eu^{2+}$, $Mn^{2+}$; wherein A is at least an alkaline-earth metal selected from the group consisting of Ba, Sr, and Ca; and D is at least a Group-IIIB metal selected from the group consisting of Al, Ga, In, and combinations thereof; which amount of phosphor is disposed adjacent to the radiation source such that the amount of phosphor absorbs at least a portion of the radiation emitted by the radiation source and emits a visible light. In one embodiment of the present invention, the light emitted by the amount of phosphor is a white light.

In still another aspect of the present invention, a method for making a phosphor comprises: (a) providing amounts of oxygen-containing compounds of magnesium; europium; manganese; at least another alkaline-earth metal, which is selected from the group consisting of barium, strontium, and calcium; and at least a Group-IIIB metal selected from the group consisting of Al, Ga, In, and combinations thereof; (b) mixing together the oxygen-containing compounds to form a mixture; and (c) firing the mixture at a temperature between about 1000° C. and about 1600° C. under a reducing atmosphere for a sufficient period of time to convert the mixture to a phosphor having a formula of $AM_gD_{10}O_{17}$: $Eu^{2+},Mn^{2+}$; wherein A is said at least another alkaline-earth metal; and D is said at least a Group-IIIB metal.

In still another aspect of the present invention, a method for making a phosphor comprises: (a) providing a first solution that comprises compounds of magnesium; europium; manganese; at least another alkaline-earth metal, which is selected from the group consisting of barium, strontium, and calcium; and at least a Group-IIIB metal selected from the group consisting of Al, Ga, In, and combinations thereof; (b) providing a second solution, which comprises at least a compound that is capable of producing a precipitate when the first and second solutions are mixed together; (c) mixing the first and second solutions to produce a precipitate containing magnesium, europium, manganese, said at least another alkaline-earth metal, and said at least a Group-IIIB metal; (d) firing the mixture under a reducing atmosphere at a temperature and for a sufficient period of time to convert the mixture to a phosphor having a formula of $AMgD_{10}O_{17}:Eu^{2+},Mn^{2+}$; wherein A is said at least another alkaline-earth metal; and D is said at least a Group-IIIB metal.

Other features and advantages of the present invention will be apparent from a perusal of the following detailed description of the invention and the accompanying drawings in which the same numerals refer to like elements.

DETAILED DESCRIPTION OF THE INVENTION

Figure 1:
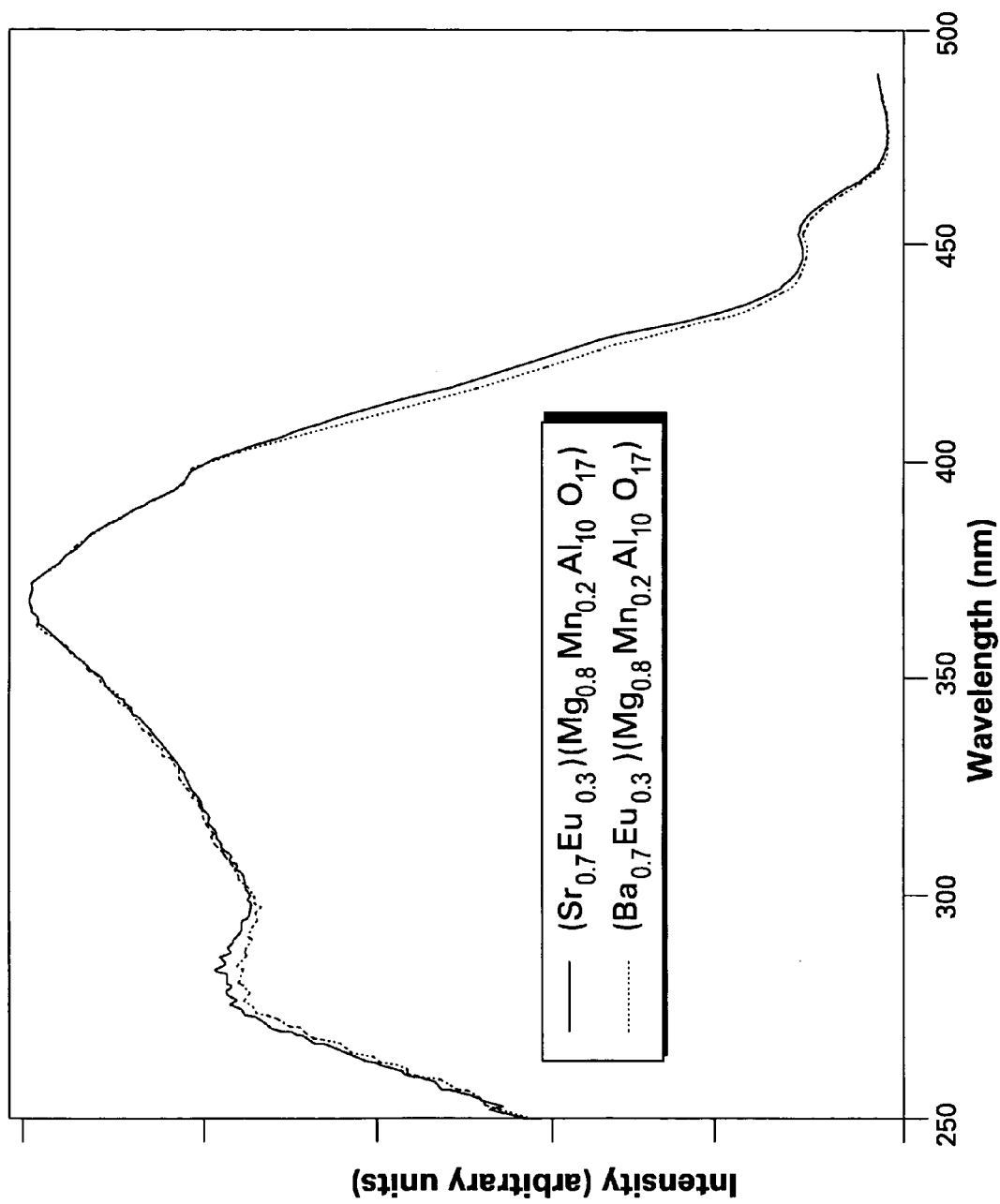
FIG. 1 shows the excitation spectra of $BaMgAl_{10}O_{17}$:$Eu^{2+},Mn^{2+}$ and $SrMgAl_{10}O_{17}$:$Eu^{2+},Mn^{2+}$.

The present invention provides phosphors that are excitable by radiation having wavelength in the range from about 250 nm to about 480 nm, preferably from about 250 nm to about 440 nm, and more preferably from about 250 nm to about 420 nm, to emit efficiently a visible light in the blue-to-green wavelengths. The terms "radiation" and "light" are used interchangeably in this disclosure. In one embodiment, a phosphor of the present invention emits in the wavelength range from about 420 nm to about 550 nm.

In general, a phosphor of the present invention comprises oxides of magnesium, at least another alkaline-earth metal, and at least a Group-IIIB metal. The term "Group-IIIB" as used herein means Group-IIIB of the Periodic Table of the Elements. The phosphors has a general formula of $AMgD_{10}O_{17}:Eu^{2+},Mn^{2+}$; wherein A is at least an alkaline-earth metal selected from the group consisting of Ba, Sr, and Ca; and D is at least a Group-IIIB metal selected from the group consisting of Al, Ga, In, and combinations thereof. The phosphors are activated with both $Eu^{2+}$ and $Mn^{2+}$. Europium ions can be present from trace amount up to about 50 atom percent of the combined A and europium ions. Manganese ions can be present from trace amount up to about 30 atom percent of the combined magnesium and manganese. In a phosphor of the present invention, the europium ions substitute for a portion of the A ions, and the manganese ions substitute for a portion of magnesium ions. Thus, the formula of a phosphor of the present invention can be written in an alternative manner as $(A_{1-a}Eu_a)(Mg_{1-b}Mn_b)D_{10}O_{17}$, wherein a is a positive number less than or equal to about 0.5, and b a positive number less than or equal to about 0.3. More particularly, $0.001 < a \leq 0.5$, and $0.001 < b \leq 0.3$.

In one embodiment, A is preferably selected from the group consisting of Sr, Ca, and combinations thereof.

In another embodiment, the amount of $Eu^{2+}$ is from about 10 to about 50 atom percent, preferably from about 20 to about 40 atom percent, of the combined A and europium ions.

In another embodiment, the amount of $Mn^{2+}$ is from about 5 to about 30 atom percent, preferably from about 10 to about 20 atom percent, of the combined Mg and Mn ions.

In another embodiment, A is barium; $0.1 \leq a \leq 0.5$; $0.1 \leq b \leq 0.3$; and D is selected from the group consisting of Al, Ga, In, and combinations thereof. In still another embodiment, D is selected from the group consisting of Ga, In, and combinations thereof.

In another embodiment, A is barium; D is selected from the group consisting of Ga, In, and combinations thereof; $0.001 < a \leq 0.5$; and $0.001 < b \leq 0.3$.

In still another embodiment, a portion of Mg is substituted with Zn in an amount from about 0.01 atom percent to about 99.99 atom percent of the combined Mg, Mn, and Zn ions. In yet another embodiment of the present invention, the level of Zn is from about 0.01 to about 50, preferably from about 0.01 to about 20 atom percent of the combined Mg, Mn, and Zn ions.

A phosphor of the present invention can be produced by a dry or a wet method. The dry method comprises: (a) providing amounts of oxygen-containing compounds of magnesium; europium; manganese; at least another alkaline-earth metal, which is selected from the group consisting of barium, strontium, and calcium; and at least a Group-IIIB metal selected from the group consisting of Al, Ga, In, and combinations thereof; (b) mixing together the oxygen-containing compounds to form a mixture; and (c) firing the mixture at a temperature between about 1000° C. and about 1600° C. under a reducing atmosphere for a sufficient period of time to convert the mixture to a phosphor having a formula of $(A_{1-a}Eu_a)(Mg_{1-b}Mn_b)D_{10}O_{17}$; wherein A is said at least another alkaline-earth metal, D is said at least a Group-IIIB metal, $0.001 < a = 0.5$, and $0.001 < b = 0.3$. A firing time in a range from about 1 minute to about 10 hours is adequate. It should be recognized that a selected firing time depends, to some extent and among other things, the amount of material to be processed, the size and/or design of the heating device that is used to accomplish the firing, the degree of mixing of the solid material during firing, and the degree of contact between the gas and solid phases. Preferably, the firing temperature is in the range from about 1400° C. to about 1600° C. The reducing atmosphere is selected from the group consisting of hydrogen, carbon monoxide, ammonia, and mixtures thereof with an inert gas selected from the group consisting of nitrogen, helium, neon, argon, krypton, and xenon. The reducing atmosphere can be a product of the combustion of carbon in limited amount of air (also known as incomplete combustion). The reducing atmosphere also can be products of decomposition of compounds that give at least one of hydrogen and carbon monoxide. For example, ammonia or hydrazine can decompose to give nitrogen and hydrogen at high temperature (greater than about 700° C.).

In one embodiment, said at least another alkaline-earth metal is selected from the group consisting of Sr, Ca, and combinations thereof.

In one preferred embodiment, the firing is conducted in a reducing atmosphere comprising hydrogen and an inert gas, such as nitrogen. For example, hydrogen comprises from about 0.001 to about 10 volume percent of the firing gas atmosphere, preferably from about 0.05 to about 4 volume percent of the firing gas atmosphere.

Non-limiting examples of oxygen-containing compounds are oxides, carbonates, nitrates, sulfates, phosphates, citrates, carboxylates (salts of carboxylic acids), and combinations thereof. Lower carboxylates, such as acetates, may be desirable.

In still another aspect of the present invention, a flux is added to the starting compounds for the preparation of the phosphor before mixing all of the compounds and flux together, and is selected from the group consisting of fluorides of at least one element selected from the group consisting of Mg; Eu; Mn; at least an alkaline-earth metal that is selected from the group consisting of Sr, Ba, and Ca, and that is desired to be present in the final phosphor; at least a Group-IIIB metal selected from the group consisting of Al, Ga, and In; and combinations thereof. When a portion of the elements having the 2+ valence is substituted with Zn, the flux can be zinc fluoride. The flux can be added into the mixture in an amount of up to about 2 mole percent of the mixture.

The oxygen-containing compounds may be mixed together by any mechanical method including, but not limited to, stirring or blending in a high-speed blender or a ribbon blender. The oxygen-containing compounds may be combined and pulverized together in a bowl mill, a hammer mill, or a jet mill. The mixing may be carried out by wet milling especially when the mixture of the oxygen-containing compounds is to be made into a solution for subsequent precipitation. If the mixture is wet, it may be dried first before being fired to a temperature in the range from about 1000° C. to about 1600° C. The drying may be carried out at ambient atmosphere or under a vacuum. The heating may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a heating time from about 1 minute to about 10 hours is adequate.

EXAMPLE 1

The following quantities of compounds were dry blended thoroughly:
SrCO$_3$: 1.550 g
Eu$_2$O$_3$: 0.792 g
MgO: 0.484 g
MnCO$_3$: 0.345 g
Al$_2$O$_3$: 7.571 g
AlF$_3$: 0.126 g The mixture was fired under an atmosphere comprising 2 percent (by volume) hydrogen in nitrogen, at a temperature of 1550° C., for about 4 hours. The phosphor had a formula of $(Sr_{0.7}Eu_{0.3})(Mg_{0.2})Al_{10}O_{17}$, as determined from the various amounts used in the preparation of the phosphor.

Other phosphors containing Ba instead of Sr were made by substituting BaCO$_3$ for SrCO$_3$ in appropriate amounts.

Figure 2:
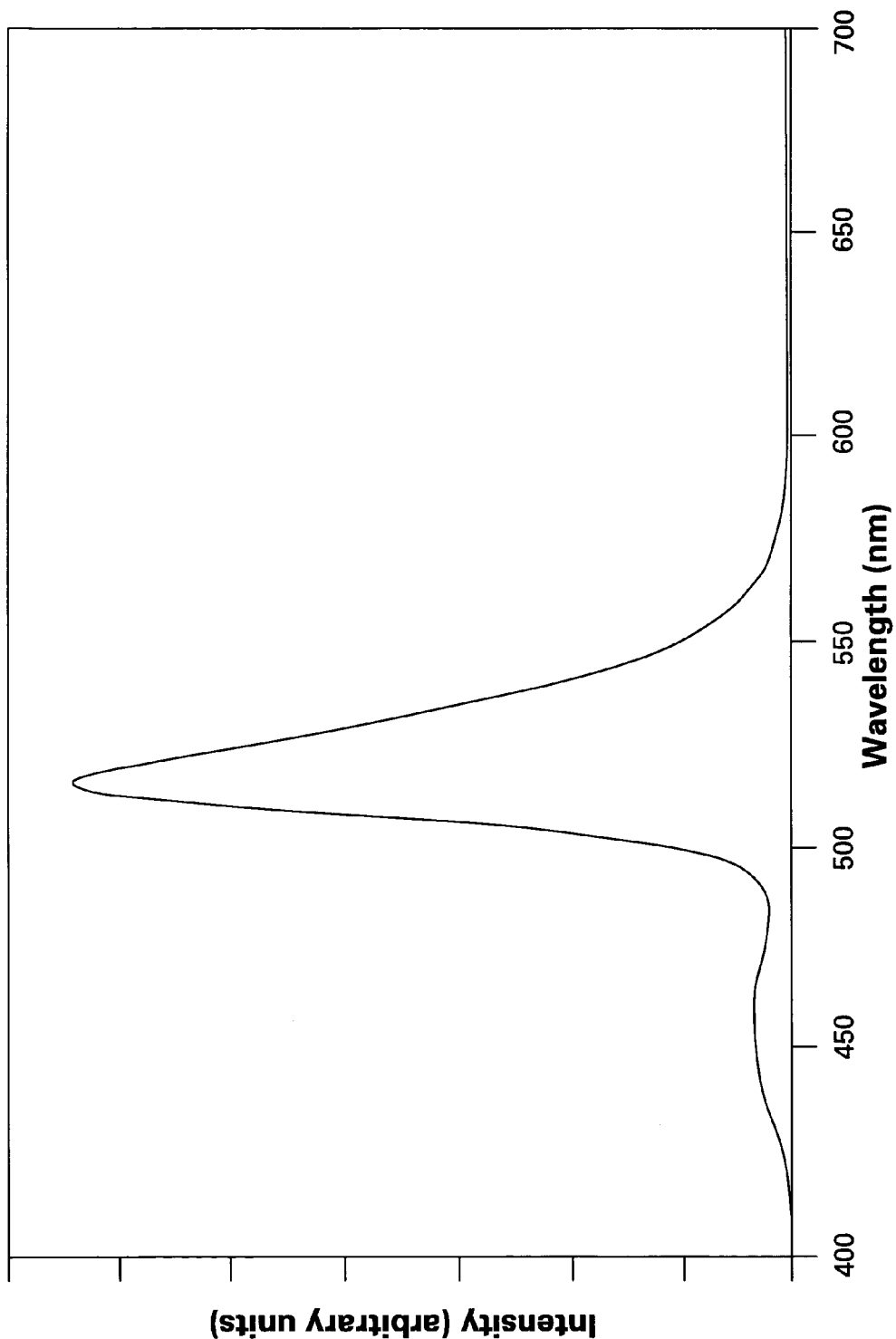
FIG. 2 shows the emission spectrum of $BaMgAl_{10}O_{17}$:$Eu^{2+},Mn^{2+}$.
Figure 3:
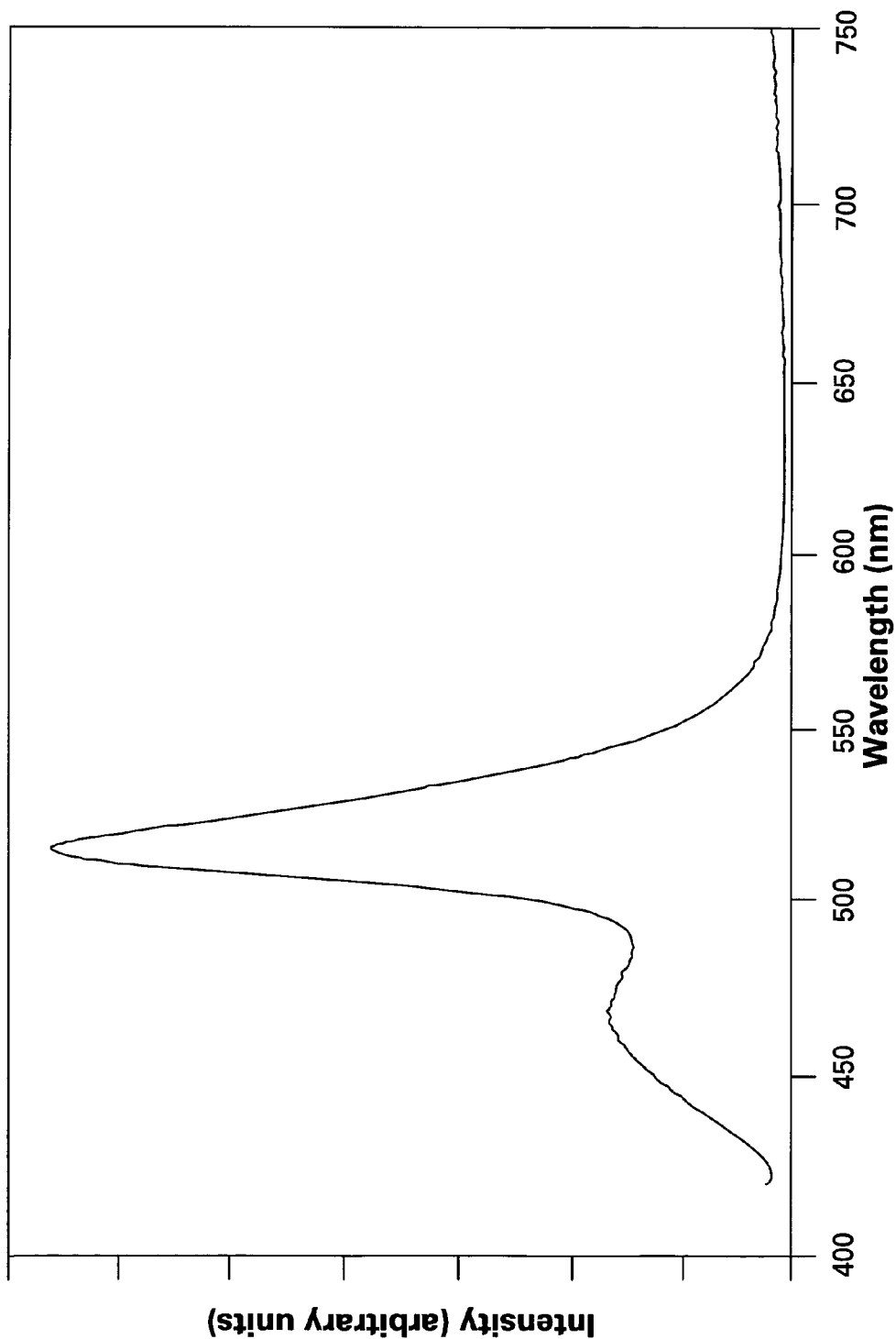
FIG. 3 shows the emission spectrum of $SrMgAl_{10}O_{17}$:$Eu^{2+},Mn^{2+}$.
Figure 4:
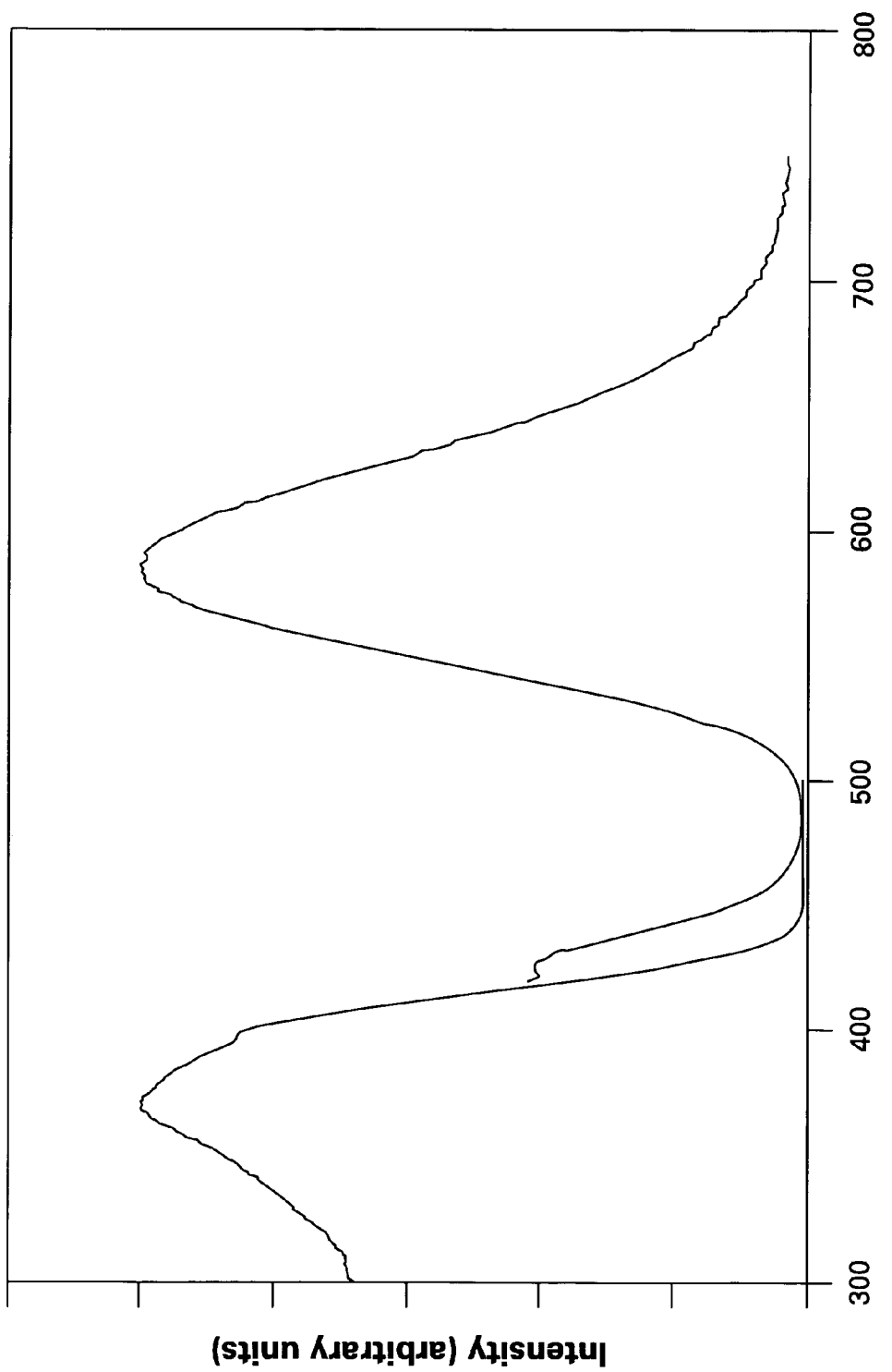
FIG. 4 shows the excitation and emission spectra of $(Sr,Ca,Mg,Zn)_2P_2O_7$:$Eu^{2+},Mn^{2+}$.
Figure 5:
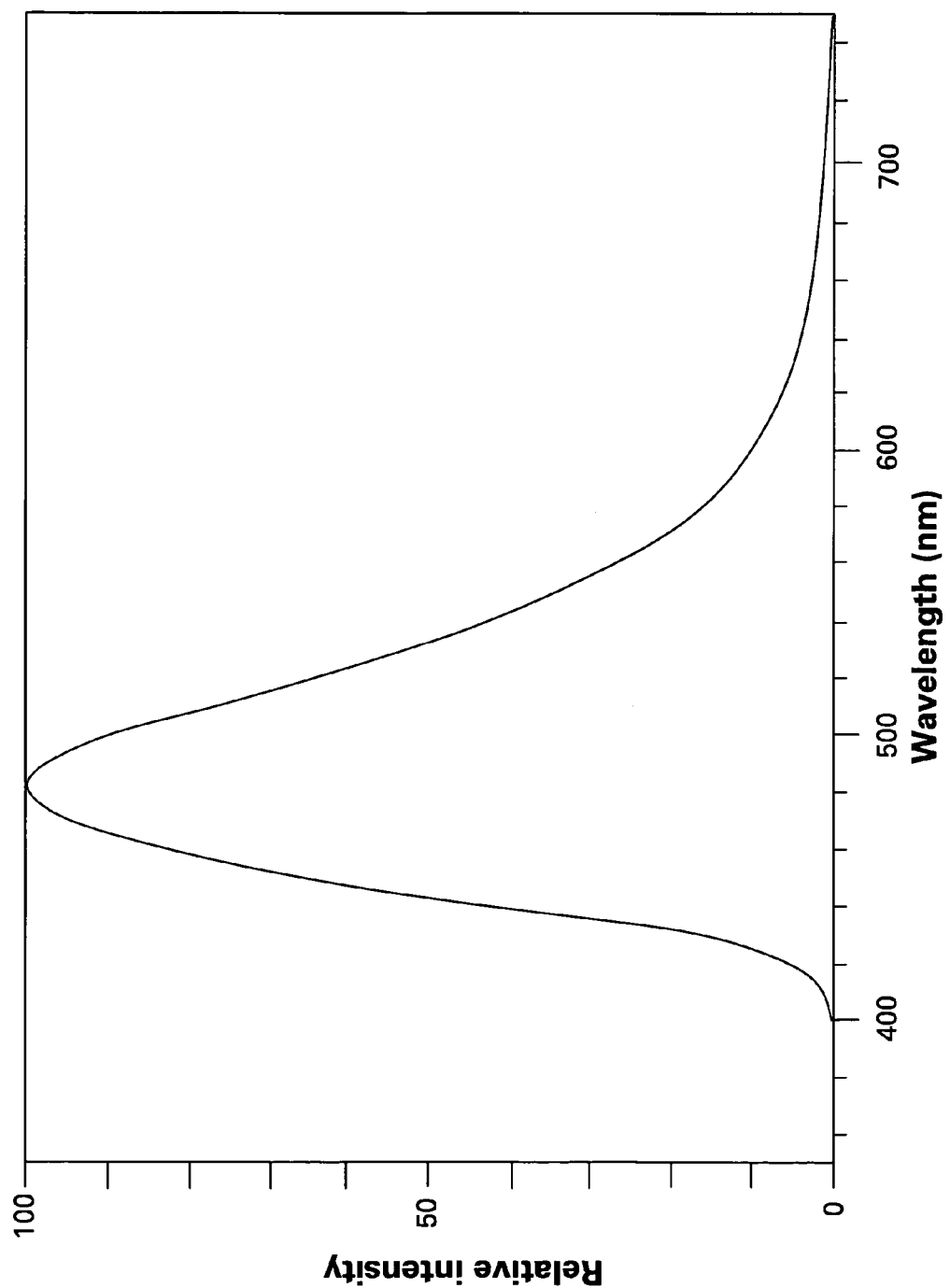
FIG. 5 shows the emission spectrum of $(Ba,Ca,Sr)_5(PO_4)_3(Cl,F,OH)$:$Eu^{2+}$.

FIG. 1 shows excitation spectra of the phosphors of the present invention, having formulas of $(Ba_{0.7}Eu_{0.3})(Mg_{0.8}Mn_{0.2})Al_{10}O_{17}$ and $(Sr_{0.7}Eu_{0.3})(Mg_{0.8}Mn_{0.2})Al_{10}O_{17}$. FIGS. 2 and 3 show emission spectra of the phosphors $(Ba_{0.7}Eu_{0.3})(Mg_{0.8}Mn_{0.2})Al_{10}O_{17}$ and $(Sr_{0.7}Eu_{0.3})(Mg_{0.8}Mn_{0.2})Al_{10}O_{17}$, respectively.

EXAMPLE 2

Some of the $Mg^{2+}$ ions of the phosphor of Example 1 were substituted with $Zn^{2+}$ ions in the following preparation.

The following quantities of compounds were dry blended thoroughly:
SrCO$_3$: 1.550 g
Eu$_2$O$_3$: 0.792 g
Mg: 0.484 g
MnCO$_3$: 0.345 g
Al$_2$O$_3$: 7.647 g
ZnF$_2$·4H$_2$O: 0.263 g The mixture was fired under an atmosphere comprising 2 percent (by volume) hydrogen in nitrogen, at a temperature of 1550° C., for about 4 hours. The phosphor has a formula of $(Sr_{0.7}Eu_{0.3})(Mg_{0.7}Mn_{0.2}Zn_{0.1})Al_{10}O_{17}$. The excitation and emission spectra of this phosphor were substantially indistinguishable from those of $(Sr_{0.7}Eu_{0.3})(Mg_{0.8}Mn_{0.2})Al_{10}O_{17}$.

Other $(Sr_{1-a}Eu_a)(Mg_{1-b}Mn_b)Al_{10}O_{17}$ phosphors of the present invention having various concentrations of $Eu^{2+}$ and $Mn^{2+}$ activators also were prepared according the dry method disclosed in Example 1 above. The percentage absorption of the exciting radiation and the CIE (Commission Internationale de l' Eclairage) chromaticity coordinates were measured and are shown in Table 1 for these phosphors and a state-of-the-art green phosphor.

TABLE 1

| Sample No. | a | b | Firing Temperature (C.) | Hydrogen in Firing Atmosphere (volume %) | Absorption (% of Exciting Radiation) | CIE Chromaticity Coordinate x | y |
|---|---|---|---|---|---|---|---|
| S10 | 0.2 | 0.1 | 1500 | 1 | 54 | 0.15 | 0.482 |
| S20 | 0.2 | 0.2 | 1550 | 2 | 55 | 0.15 | 0.595 |
| S30 | 0.4 | 0.2 | 1550 | 2 | 62 | 0.15 | 0.621 |
| S40 | 0.4 | 0.2 | 1550 | 2 | 67 | 0.148 | 0.651 |
| a commercial phosphor having a formula of BaMgAl$_{10}$O$_{17}$: Eu$^{2+}$, Mn$^{2+}$ (method of preparation and levels of Eu$^{2+}$ and Mn$^{2+}$ are unknown) | | | | | 37 | 0.15 | 0.69 |

Thus, it is seen that phosphors of the present invention have a larger degree of absorption of the exciting radiation than the commercial phosphor that emits similar light color (as represented by the CIE chromaticity coordinate) at similar particle size. Consequently, the phosphors of the present invention are more energy efficient than the commercial phosphor.

In another embodiment, a phosphor of the present invention is prepared by a wet method that comprises: (a) providing a first solution that comprises compounds of magnesium; europium; manganese; at least another alkaline-earth metal, which is selected from the group consisting of barium, strontium, and calcium; and at least a Group-IIIB metal selected from the group consisting of Al, Ga, and In; (b) providing a second solution, which comprises at least a compound that is capable of producing a precipitate when the first and second solutions are mixed together; (c) mixing the first and second solutions to produce a precipitate containing magnesium, europium, manganese, said at least another alkaline-earth metal, and said at least a Group-IIIB metal; and (d) firing the mixture under a reducing atmosphere at a temperature and for a sufficient period of time to convert the mixture to a phosphor having a formula of $(A_{1-a}Eu_a)(Mg_{1-b}Mn_b)D_{10}O_{17}$; wherein A is said at least another alkaline-earth metal; D is said at least a Group-IIIB metal; $0.001 < a \leq 0.5$; and $0.001 < b \leq 0.3$. The second solution can comprise a compound selected from the group consisting of ammonium hydroxide; and hydroxides of at least one element selected from the group consisting of magnesium, europium, manganese, said at least another alkaline-earth metal, and said at least a Group-IIIB metal. The second solution can also comprise at least a compound selected from the group consisting of organic esters of carboxylic acids; organic amines; and combinations thereof.

In one embodiment, said at least another alkaline-earth metal is selected from the group consisting of strontium and calcium.

In another embodiment, said at least another alkaline-earth metal is barium, the amount of a europium compound is selected such that the final phosphor comprises from about 20 to about 50 atom percent of the combined barium and europium, and the amount of a manganese compound is selected such that the final phosphor comprises from about 10 to about 30 atom percent of the combined magnesium and manganese.

The firing temperature is in the range from about 1000° C. to about 1600° C. A firing time can be selected in the range from 1 minute to about 10 hours. The firing time depends, to some extent, the same factors that are discussed in connection with the dry method of preparation.

In one embodiment, the first solution is simply an aqueous solution if the compounds of the first solution are soluble in water.

In another embodiment, oxides or other oxygen-containing compounds of at least magnesium; europium; manganese; at least one alkaline-earth metal other than manganese; and at least a Group-IIIB metal selected from the group consisting of Al, Ga, and In are dissolved in an acidic solution, such as hydrochloric acid, nitric acid, sulfuric acid, citric acid, or acetic acid. The strength of the acidic solution is chosen to rapidly dissolve the oxides or the oxygen-containing compounds, and the choice of the strength of the acidic solution is within the skill of a person skilled in the art. Ammonium hydroxide is then added in increments to the acidic solution containing said magnesium; said europium; said manganese; said at least one alkaline-earth metal; and said at least a Group-IIIB metal while stirring to precipitate a mixture of hydroxides of said magnesium; said europium; said manganese; said at least one alkaline-earth metal; and said at least a Group-IIIB metal. An organic base; such as methanolamine, ethanolamine, propanolamine, dimethanolamine, diethanolamine, dipropanolamine, trimethanolamine, triethanolamine, or tripropanolamine; may be used in place of ammonium hydroxide. Alternatively, an ester of an organic acid may be used to carry out the precipitation; such as methyl, ethyl, or propyl esters of acetic acid, propionic acid, butyric acid, oxalic acid, malonic acid, succinic acid, or glutaric acid; dimethyl, diethyl, dipropyl esters of oxalic acid, malonic acid, succinic acid, or glutaric acid. The precipitate is filtered, washed with deionized water, and optionally dried. The dried precipitate is ball milled or otherwise thoroughly blended and then heated in a reducing atmosphere at a temperature in the range from about 1000° C. to about 1600° C., preferably from about 1400° C. to about 1600° C. Alternatively, the wet precipitate can be heated first, and then ball milled or otherwise thoroughly blended afterward.

Phosphor Blends

Each of samples S10, S20, S30, and S40 of phosphors of the present invention (shown in Table 1 above) can be blended with the phosphor $(Sr,Ca,Mg,Zn)_2P_2O_7:Eu^{2+},Mn^{2+}$ (emitting yellow-orange light, hereinafter called "SPP") and the phosphor $(Sr,Ba,Ca)_5(PO_4)_3(Cl,F,OH):Eu^{2+}$ (emitting blue light, hereinafter called "SECA") to provide the same light emitted by a commercial phosphor blend consisting of SPP and $Sr_4Al_{14}O_{25}:Eu^{2+}$ (hereinafter called "SAE"). As used herein and throughout the description, elements listed within parenthesis and separated by commas of a given formula refer to at least one of the elements contributing by an amount mentioned in the subscript, outside of the parenthesis. The "at least one" as used above refers to one or a combination of the elements. The light emitted by these blends have substantially the same CIE chromaticity coordinate of x=0.387 and y=0.41, and a correlated color temperature of about 4100 K. Such light characteristics can be obtained with a composite spectrum consisting of 71% contribution from SPP, 9% contribution from SECA, and 21% contribution from a phosphor selected from the group consisting of S10, S20, S30, and S40. The luminosity of each phosphor blend is shown in Table 2.

TABLE 2

| Phosphor Blend | Luminosity (lumens per watt) |
| --- | --- |
| S10 + SPP + SECA | 355 |
| S20 + SPP + SECA | 359 |
| S30 + SPP + SECA | 360 |
| S40 + SPP + SECA | 361 |
| Commercial phosphor of Table 1 + SPP + SECA | 361 |
| Commercial phosphor blend SPP + SAE | 344 |

Thus, a phosphor blend consisting of one of the phosphors of the present invention, SPP, and SECA can emit light having the same characteristic as that of the commercial phosphor blend, but provides a higher luminosity.

A combination of a phosphor of the present invention and at least another phosphor other than those disclosed above produces a phosphor blend that emits in the visible spectrum. Said at least another phosphor is selected from the group of phosphors that emit blue, green, blue-green, yellow, yellow-orange, orange-red, and red color so as to produce a desired light color and/or correlated color temperature. Furthermore, said at least another phosphor can be a phosphor that absorbs in the wavelength range from about 250 nm to about 480 nm, and preferably from about 250 nm to about 420 nm.

Non-limiting examples of blue light-emitting phosphors are $(Ba,Sr,Ca)_5(PO_4)_3(Cl,F,OH):Eu^{2+}$; $(Ba,Sr,Ca)MgAl_{10}O_{17}:Eu^{2+}$; and $(Ba,Sr,Ca)BPO_5:Eu^{2+}$.

Non-limiting examples of phosphors that emit blue-green light are $Sr_4Al_{14}O_{25}:Eu^{2+}$; $BaAl_8O_{13}:Eu^{2+}$; $2SrO \cdot 0.84P_2O_5 \cdot 0.16B_2O_3:Eu^{2+}$; $MgWO_4$; $BaTiP_2O_8$; $(Ba,Sr,Ca)MgAl_{10}O_{17}:Eu^{2+},Mn^{2+}$; and $(Ba,Sr,Ca)_5(PO_4)_3(Cl,F,OH):Sb^{3+}$.

Non-limiting examples of phosphors that emit green light are $LaPO_4:Ce^{3+},Tb^{3+}$; $CeMgAl_{11}O_{19}:Tb^{3+}$; $GdMgB_5O_{10}:Ce^{3+}, Tb^{3+}, Mn^{2+}$; and $GdMgB_5O_{10}:Ce^{3+}, Tb^{3+}$.

Non-limiting examples of phosphors that emit yellow-orange light are $(Tb,Y,Lu,La,Gd)_3(Al,Ga)_5O_{12}:Ce^{3+}$; and $(Ba,Sr,Ca)_5(PO_4)_3(Cl,F,OH):Eu^{2+}, Mn^{2+}, Sb^{3+}$.

Non-limiting examples of phosphors that emit red light are $(Y,Gd,La,Lu,Sc)_2O_3:Eu^{3+}$; $(Y,Gd,La,In,Lu,Sc)BO_3:Eu^{3+}$; $(Y,Gd,La)(Al,Ga)O_3:Eu^{3+}$; $(Ba,Sr,Ca)(Y,Gd,La,Lu)_2O_4:Eu^{3+}$; $(Y,Gd)Al_3B_4O_{12}:Eu^{3+}$; monoclinic $Gd_2O_3:Eu^{3+}$; $(Gd,Y)_4(Al,Ga)_2O_9:Eu^{3+}$; $(Ca,Sr)(Gd,Y)_3(Ge,Si)Al_3O_9:Eu^{3+}$; $(Sr,Mg)_3(PO_4)_2:Sn^{2+}$; $GdMgB_5O_{10}:Ce^{3+},Mn^{2+}$; and $3.5MgO \cdot 0.5MgF_2 - GeO_2:Mn^{4+}$.

Visible Light-Emitting Device

Incorporation of a phosphor of the present invention in a device comprising a radiation source that emits in the near UV-to-blue wavelength range (from about 250 nm to about 480 nm) provides a visible light source that uses electrical power efficiently. In one embodiment, the radiation source emits radiation having wavelengths in a range from about 250 nm to about 420 nm. In one embodiment, the radiation source is a UV/blue LED. The visible light source may be fabricated to provide a point source device by using one such UV/blue LED or a large-area lighting device by using a plurality of such UV/blue LEDs.

Figure 6:
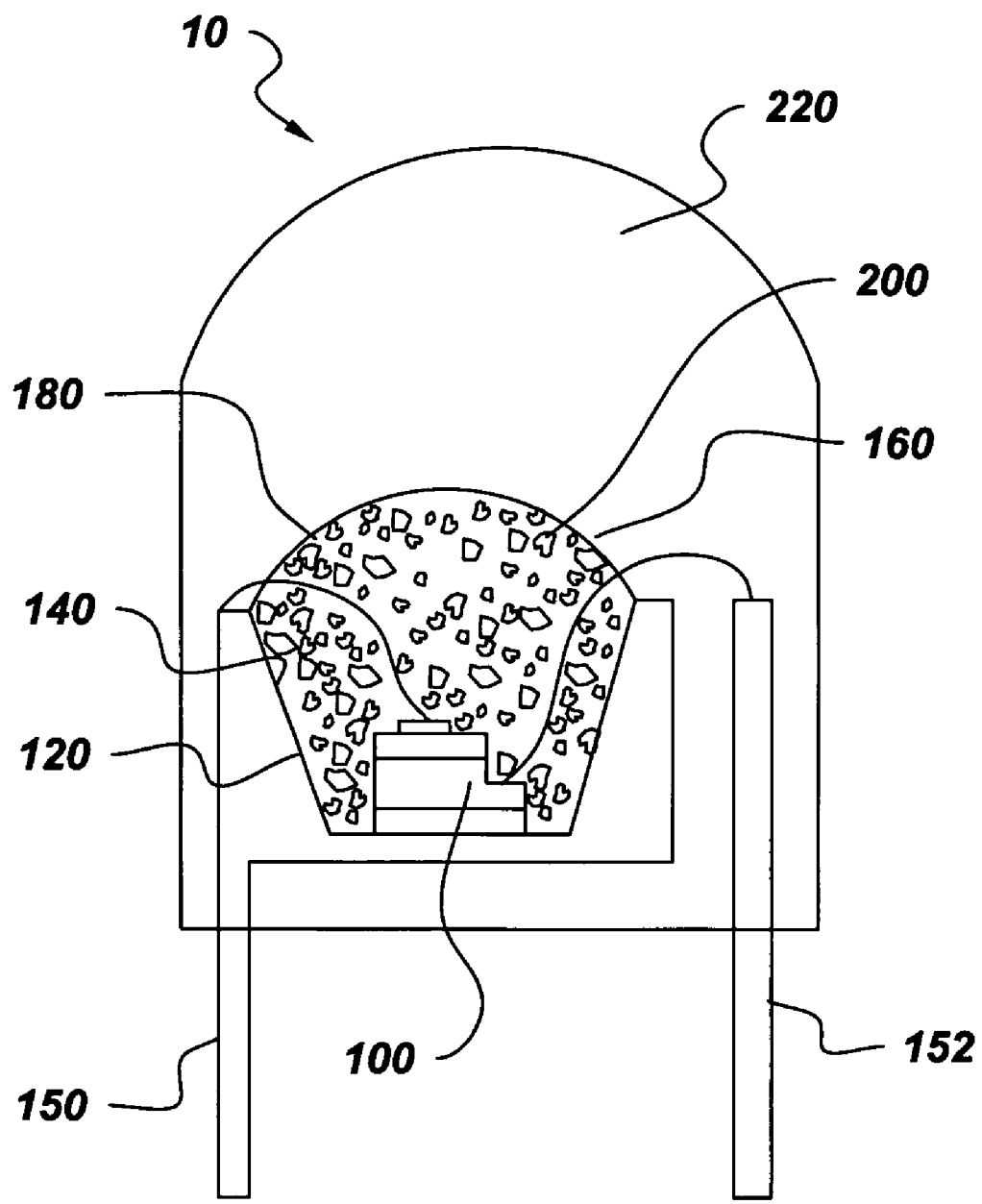
FIG. 6 shows schematically a light source comprising an LED and a phosphor of the present invention.

In one embodiment of the present invention as shown in FIG. 6, a light source 10 emitting visible light comprises a UV/blue LED 100 emitting light at least in a portion of the wavelength range of about 250 nm to about 480 nm and a phosphor of the present invention. The UV/blueLED 100 is mounted in a cup 120 having a reflective surface 140 adjacent LED 100. Blue LEDs suitable for white light-emitting devices are InGaN semiconductor-based LEDs such as those of U.S. Pat. 5,777,350 mentioned above, which is incorporated herein by reference. Other UV/blue LEDs also may be used, such as LEDs based on GaN semiconductor doped with various metals to provide a large band gap. Electrical leads 150 and 152 are provided to supply electrical power to the LED 100. A transparent casting 160 comprising an epoxy, a silicone, or glass 180 in which there are dispersed substantially uniformly particles 200 of a phosphor of the present invention. Then a molded seal 220 of a transparent material, such as an epoxy or a silicone, is formed around the assembly of LED and phosphor casting to provide a hermetic seal thereto. Alternatively, the phosphor particles may be applied on the LED 100 or dispersed in only a portion of the transparent casting 160. Other transparent polymers also may be used to form the transparent casting. In addition, particles of a light scattering material, such as $TiO_2$ or $A_2O_3$, may be included in the transparent casting among the phosphor particles to improve the uniformity of the light emitted from the light source 10. The composition of the InGaN active layer of the LED and the quantity of the phosphor applied in the casting may be chosen such that a portion of the blue light emitted by the LED that is not absorbed by the phosphor and the broad-spectrum light emitted by the phosphor are combined to provide the white light source 10 of a desired color temperature and CRI.

Figure 7:
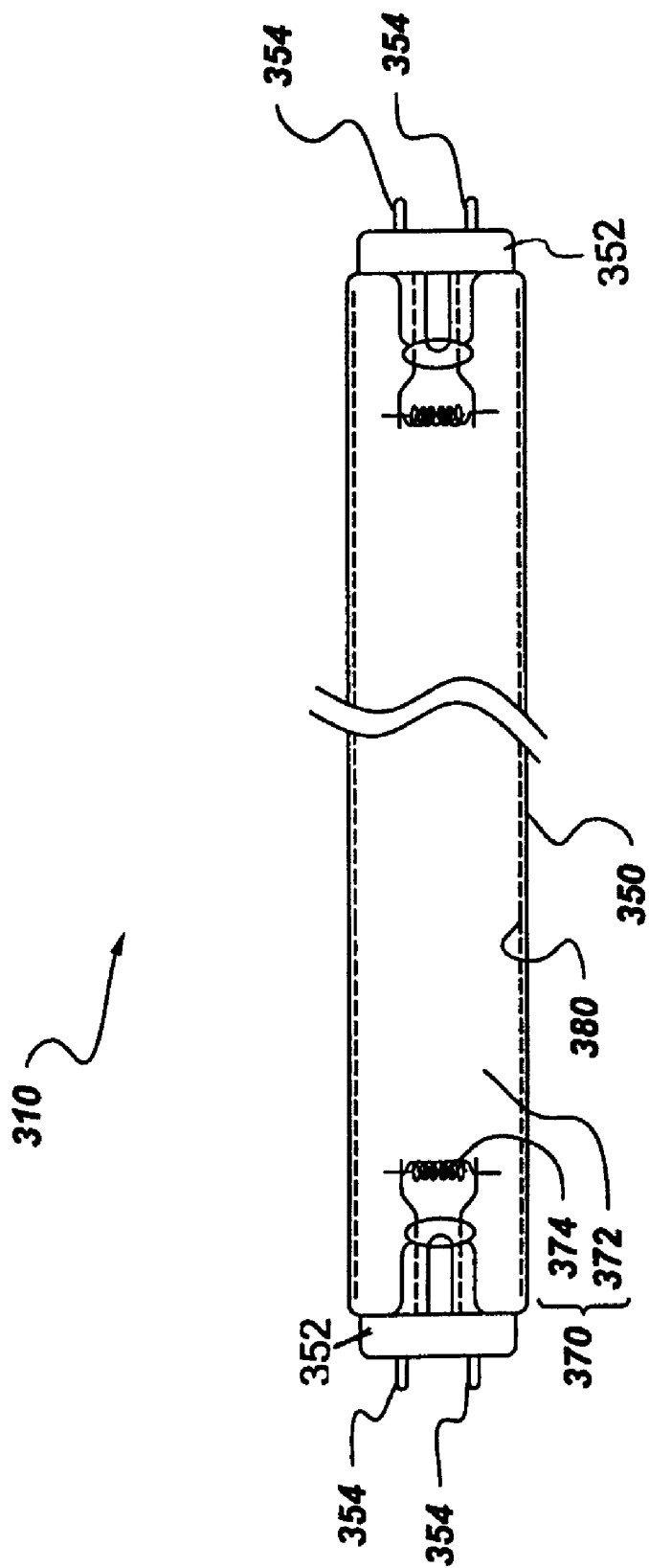
FIG. 7 shows schematically a light source comprising a gas discharge and a phosphor of the present invention.

In another embodiment, the radiation source is a gas discharge device. Non-limiting examples of gas discharge devices are low-, medium-, and high-pressure mercury gas discharge lamps. FIG. 7 shows a light source based on a gas discharge device and a phosphor of the present invention. Light source 310 comprises an evacuated sealed housing 350, a means 370 for generating UV radiation, which means is located within housing 350, and a phosphor blend 380 located within housing 350 and adapted to be excited by UV radiation. In one embodiment, light source 310 is a fluorescent lamp and evacuated housing 350 comprises an evacuated glass tube and associated end caps 352. In another embodiment, the phosphor blend is disposed on an inner surface of housing 350. Means 370 for generating UV radiation is a combination of a gas comprising a means 374 for generating high-energy electrons and a means 372 for absorbing the energy of the high-energy electrons. In one embodiment, means 372 for absorbing energy of high-energy electrons is a gas comprising mercury vapor, which absorbs energy of the high-energy electrons to create a mercury vapor discharge to excite the phosphor. In addition to mercury vapor, the gas can comprise an inert gas such as argon, krypton, or xenon. Means 374 for generating high-energy electrons may be a filament of a metal having a low work function (such as less than 4.5 eV), such as tungsten, or such a filament coated with alkaline earth metal oxides as are known in the art. Pins 354 are provided to supply electrical power to electron-generating means 374. The filament is coupled to a high-voltage source to generate electrons from the surface thereof. A phosphor of the present invention may be used in combination with other conventional phosphors used in fluorescent lighting technology. For example, a phosphor of the present invention may be combined with conventional red, green, and blue light-emitting phosphors, as disclosed herein above, to produce white light from a mercury discharge lamp. A particulate material comprising $TiO_2$ and/or $Al_2O_3$ can be used in conjunction with the phosphor blend to scatter light generated by light source 310. Such a light scattering material can be blended into the phosphor blend or disposed as a layer between the inner surface of housing 350 and phosphor layer 380. It may be advantageous to have the size of the particles of the scattering material in the range from about 10 nm to about 400 nm. Although light source 310 shown in FIG. 7 comprises a straight housing 350, it should be understood that other housing shapes also are applicable. For example, a compact fluorescent lamp can have a housing that has one or more bends, and electrical supply pins 354 are disposed at one end of light source 310.

A phosphor of the present invention also can be used as a component of a phosphor blend for cathode-ray tubes, which phosphor blend comprises other phosphors emitting in the visible wavelength range from blue to red. In this case, the high-energy electrons bombard a screen on which a coating of the phosphor blend is disposed to emit light in the visible spectral region.

While specific preferred embodiments of the present invention have been described in the foregoing, it will be appreciated by those skilled in the art that many modifications, substitutions, or variations may be made thereto without departing from the spirit and scope of the invention as defined in the appended claims.

What is claimed is:

1. A phosphor comprising a material having a formula of $AMgD_{10}O_{17}:Eu^{2+},Mn^{2+}$, wherein A is at least an alkaline-earth metal selected from the group consisting of Ba, Sr, Ca, and combinations thereof; and D is at least a metal selected from the group consisting of Ga, In, and combinations thereof; wherein $Eu^{2+}$ ions are present in an amount from about 10 to about 50 atom percent of a combined quantity of A ions and europium ions, and $Mn^{2+}$ ions are present in an amount from about 5 to about 30 atom percent of a combined quantity of magnesium ions and manganese ions.

2. A phosphor comprising a material having a formula of $AMgD_{10}O_{17}:Eu^{2+},Mn^{2+}$, wherein A is at least an alkaline-earth metal selected from the group consisting of Sr, Ca, and combinations thereof; and D is at least a metal selected from the group consisting of Ga, In, and combinations thereof; wherein $Eu^{2+}$ ions are present in an amount from about 10 to about 50 atom percent of a combined quantity of A ions and europium ions, and $Mn^{2+}$ ions are present in an amount from about 5 to about 30 atom percent of a combined quantity of magnesium ions and manganese ions.

3. The phosphor according to claim 1, wherein $Eu^{2+}$ ions are present in an amount from about 20 to about 40 atom percent of a combined quantity of A ions and europium ions, and $Mn^{2+}$ ions are present in an amount from about 10 to about 20 atom percent of a combined quantity of magnesium ions and manganese ions.

4. The phosphor according to claim 1, wherein a portion of magnesium ions is substituted with Zn in an amount from about 0.01 to about 99.99 atom percent of a combined quantity of Mg, Mn, and Zn ions.

5. A method for producing a phosphor, the method comprising:
providing amounts of oxygen-containing compounds of magnesium; europium; manganese; at least another alkaline-earth metal, which is selected from the group consisting of barium, strontium, calcium, and combinations thereof; and at least a metal of Group III-B of the Periodic Table of the Elements, the metal of Group-IIIB being selected from the group consisting of Ga, In, and combinations thereof;
mixing together the oxygen-containing compounds to form a mixture; and
firing the mixture at a temperature between about 1000° C. and about 1600° C. under a reducing atmosphere for a sufficient period of time to convert the mixture to said phosphor having a formula of $(A_{1-a}Eu_a)(Mg_{1-b}Mn_b)D_{10}O_{17}$; wherein A is said at least another alkaline-earth metal, D is said at least a metal of Group-IIIB, $0.001 < a \leq 0.5$, and $0.001 < b \leq 0.3$.

6. The method according to claim 5, wherein the reducing atmosphere is selected from the group consisting of hydrogen, carbon monoxide, ammonia, and mixtures thereof with an inert gas selected from the group consisting of nitrogen, helium, neon, argon, krypton, and xenon.

7. The method according to claim 5, wherein the reducing atmosphere is selected from the group consisting of a product of a incomplete combustion carbon in air, and decomposition products of compounds that give at least one gas selected from the group consisting of hydrogen and carbon monoxide.

8. The method according to claim 5, wherein the reducing atmosphere is selected from the group consisting of decomposition products of ammonia and hydrazine.

9. The method according to claim 5, wherein the firing temperature is in a range from about 1400° C. to about 1600° C.

10. The method according to claim 5, wherein the firing time is in a range from about 1 minute to 10 hours.

11. The method according to claim 5, wherein the oxygen-containing compounds are selected from the group consisting of oxides, carbonates, nitrates, sulfates, phosphates, citrates, carboxylates, and combinations thereof.

12. The method according to claim 5, further comprising adding a flux to the oxygen-containing compounds before the step of mixing, wherein the flux comprises a fluoride of at least an element selected from the group consisting of Mg, Eu, Mn, said at least an alkaline-earth metal, and said at least a Group-IIIB metal.

13. A method for producing a phosphor, the method comprising:
providing a first solution that comprises compounds of magnesium; europium; manganese; at least another alkaline-earth metal, which is selected from the group consisting of barium, strontium, and calcium; and at least a Group-IIIB metal selected from the group consisting of Ga, In, and combinations thereof;
providing a second solution, which comprises at least a compound that is capable of producing a precipitate when the first and second solutions are mixed together;
mixing the first and second solutions to produce a precipitate containing magnesium, europium, manganese, said at least another alkaline-earth metal, and said at least a Group-IIIB metal; and
firing the mixture under a reducing atmosphere at a temperature and for a sufficient period of time to convert the mixture to a phosphor having a formula of $(A_{1-a}Eu_a)(Mg_{1-b}Mn_b)D_{10}O_{17}$; wherein A is said at least another alkaline-earth metal; D is said at least a Group-IIIB metal; $0.001 < a \leq 0.5$, and $0.001 < b \leq 0.3$.

14. The method according to claim 13, wherein the second solution comprises a compound selected from the group consisting of ammonium hydroxide; and hydroxides of at least one element selected from the group consisting of magnesium, europium, manganese, said at least another alkaline-earth metal, and said at least a Group-IIIB metal.

15. The method according to claim 13, wherein the second solution comprises a compound selected from the group consisting of organic esters of carboxylic acids, organic amines, and combinations thereof.

16. The method according to claim 13, wherein the reducing atmosphere is selected from the group consisting of hydrogen, carbon monoxide, ammonia, and mixtures thereof with an inert gas selected from the group consisting of nitrogen, helium, neon, argon, krypton, and xenon.

17. The method according to claim 13, wherein the reducing atmosphere is selected from the group consisting of a product of a incomplete combustion carbon in air, and decomposition products of compounds that give at least one gas selected from the group consisting of hydrogen and carbon monoxide.

18. The method according to claim 13, wherein the reducing atmosphere is selected from the group consisting of decomposition products of ammonia and hydrazine.

19. The method according to claim 13, wherein the firing temperature is in a range from about 1400° C. to about 1600° C.

20. The method according to claim 13, wherein the firing time is in a range from about 1 minute to 10 hours.

21. A phosphor blend comprising:
a phosphor comprising a material having a formula of $AMgD_{10}O_{17}:Eu^{2+},Mn^{2+}$, wherein A is at least an alkaline-earth metal selected from the group consisting of Ba, Sr, Ca, and combinations thereof; and D is at least a metal selected from the group consisting of Ga, In, and combinations thereof; wherein $Eu^{2+}$ ions are present in an amount from about 10 to about 50 atom percent of a combined quantity of A ions and europium ions, and $Mn^{2+}$ ions are present in an amount from about 5 to about 30 atom percent of a combined quantity of magnesium ions and manganese ions; and
at least another phosphor emitting a light color selected from the group consisting of blue, blue-green, green, yellow, yellow-orange, orange-red, and red.

22. The phosphor blend according to claim 21, wherein said at least another phosphor is selected from the group consisting of (Ba,Sr,Ca)$_5$(PO$_4$)$_3$(Cl,F,OH):Eu$^{2+}$; (Ba,Sr,Ca)MgAl$_{10}$O$_{17}$:Eu$^{2+}$; (Ba,Sr,Ca)BPO$_5$:Eu$^{2+}$; Sr$_4$Al$_{14}$O$_{25}$:Eu$^{2+}$; BaAl$_8$O$_{13}$:Eu$^{2+}$; 2SrO.0.84P$_2$O$_5$.0.16B2O$_3$:Eu$^{2+}$; MgWO$_4$; BaTiP$_2$O$_8$; (Ba,Sr,Ca)MgAl$_{10}$O$_{17}$:Eu$^{2+}$,Mn$^{2+}$; (Ba,Sr,Ca)$_5$(PO$_4$)$_3$(Cl,F,OH):Sb$^{3+}$; LaPO$_4$:Ce$^{3+}$,Tb$^{3+}$; CeMgAl$_{11}$O$_{19}$:Tb$^{3+}$; GdMgB$_5$O$_{10}$:Ce$^{3+}$,Tb$^{3+}$,Mn$^{2+}$; GdMgB$_5$O$_{10}$:Ce$^{3+}$,Tb$^{3+}$; (Tb,Y,Lu,La,Gd)$_3$(Al,Ga)$_5$O$_{12}$:Ce$^{3+}$; (Ba,Sr,Ca)$_5$(PO$_4$)$_3$(Cl,F,OH):Eu$^{2+}$,Mn$^{2+}$,Sb$^{3+}$; (Y,Gd,La,Lu,Sc)$_2$O$_3$:Eu$^{3+}$; (Y,Gd,La,In,Lu,Sc)BO$_3$:Eu$^{3+}$; (Y,Gd,La)(Al,Ga)O$_3$:Eu$^{3+}$; (Ba,Sr,Ca)(Y,Gd,La,Lu)$_2$O$_4$:Eu$^{3+}$; (Y,Gd)Al$_3$B$_4$O$_{12}$:Eu$^{3+}$; monoclinic Gd$_2$O$_3$:Eu$^{3+}$; (Gd,Y)$_4$(Al,Ga)$_2$O$_9$:Eu$^{3+}$; (Ca,Sr)(Gd,Y)$_3$(Ge,Si)Al$_3$O$_9$:Eu$^{3+}$; (Sr,Mg)$_3$(PO$_4$)$_2$:Sn$^{2+}$; GdMgB$_5$O$_{10}$:Ce$^{3+}$,Mn$^{2+}$; 3.5MgO-0.5MgF$_2$—GeO$_2$:Mn$^{4+}$.

23. The phosphor blend according to claim 21, wherein said at least another phosphor is selected from the group consisting of
(Sr,Ca,Mg,Zn)$_2$P$_2$O$_7$:Eu$^{2+}$,Mn$^{2+}$; (Sr,Ba,Ca)$_5$(PO$_4$)$_3$(Cl,F,OH):Eu$^{2+}$; and Sr$_4$A$_{14}$O$_{25}$:Eu$^{2+}$.

24. A light source emitting visible light, the light source comprising:
a radiation source that emits in a wavelength range from about 250 nm to about 480 nm; and
a phosphor having a fonnula of $(A_{1-a}Eu_a)(Mg_{1-b}Mn_b)D_{10}O_{17}$; wherein A is at least an alkaline-earth metal other than Mg, D is at least a Group-IIIB consisting of Ga, In, and combinations thereof; $0.001 < a \leq 0.5$, and $0.001 < b \leq 0.3$, which phosphor is disposed adjacent to the radiation source to receive the radiation and emit the visible light.

25. The light source according to claim 24, wherein the radiation source comprises a UV/blue light emitting diode ("LED").

26. The light source according to claim 25, wherein the phosphor is dispersed in a transparent casting, which is disposed adjacent to the radiation source.

27. The light source according to claim 24, wherein the radiation source emits radiation having wavelengths in a range from about 250 nm to about 420 nm.

28. The light source according to claim 24, wherein the phosphor is a component of a phosphor blend that comprises at least one other phosphor emitting light selected from the group consisting of blue, blue-green, green, yellow, yellow-orange, orange-red, and red light.

29. The light source according to claim 26, further comprising particles of a scattering material dispersed in the transparent casting.

30. The light source according to claim 24, wherein the radiation source is a gas discharge device.

31. The light source according to claim 30, wherein the gas discharge device is selected from the group consisting of low-, medium-, and high-pressure mercury gas discharge lamps.

32. The light source according to claim 30, wherein the phosphor is a component of a phosphor blend that comprises at least one other phosphor emitting light selected from the group consisting of blue, blue-green, green, yellow, yellow-orange, orange-red, and red light.

* * * * *

UNITED STATES PATENT AND TRADEMARK OFFICE
CERTIFICATE OF CORRECTION

PATENT NO. : 7,077,978 B2
APPLICATION NO. : 10/644103
DATED : July 18, 2006
INVENTOR(S) : Anant Achyut Setlur, Alok Mani Srivastava and Holly Ann Comanzo It is certified that error appears in the above-identified patent and that said Letters Patent is hereby corrected as shown below:

In column 5, line 37, replace "ajet" with --a jet--.

In column 5, line 66, replace "(Sr0.7Eu0.3)(Mg0.2)Al10O17" with --(Sr0.7Eu0.3)(Mg0.8Mn0.2)Al10O17--.

In Claim 24, column 13, line 25, replace the word "fonnula" with --formula--.

In Claim 24, column 13, line 27, insert the word --metal-- after "Group-IIIB".

Signed and Sealed this

Eighteenth Day of August, 2009

David J. Kappos
*Director of the United States Patent and Trademark Office*